(12) United States Patent
Ota (10) Patent No.: US 8,717,779 B2
(45) Date of Patent: May 6, 2014

(54) HOLDER FOR HOLDING CABLE NOISE SUPPRESSOR AND IMAGE FORMING SYSTEM INCORPORATING THE SAME

(75) Inventor: Yoshihide Ota, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 260 days.

(21) Appl. No.: 13/368,503

(22) Filed: Feb. 8, 2012

(65) Prior Publication Data
US 2012/0230005 A1 Sep. 13, 2012

(30) Foreign Application Priority Data

Mar. 10, 2011 (JP) ................................. 2011-053356

(51) Int. Cl.
*H02B 1/20* (2006.01)

(52) U.S. Cl.
USPC ............................. 361/827; 361/825; 361/810

(58) Field of Classification Search
USPC ......... 361/111, 117–118, 816, 818, 752, 753, 361/794, 825–827, 807, 809, 810; 174/68.1, 91, 92, 350, 32, 117 F
See application file for complete search history.

(56) References Cited

U.S. PATENT DOCUMENTS

| | | | |
|---|---|---|---|
| 6,334,250 B1 * | 1/2002 | Maeda et al. .................... | 29/857 |
| 6,603,077 B2 * | 8/2003 | Hirai ............................... | 174/78 |
| 7,516,540 B2 * | 4/2009 | Ueda et al. ...................... | 29/745 |
| 7,751,751 B2 | 7/2010 | Ohta et al. | |
| 7,873,303 B2 | 1/2011 | Ohta et al. | |
| 7,878,725 B2 | 2/2011 | Ohkubo et al. | |
| 7,937,028 B2 | 5/2011 | Ogawa et al. | |
| 7,963,524 B2 | 6/2011 | Ohta | |
| 7,982,923 B2 | 7/2011 | Andoh et al. | |
| 8,032,071 B2 | 10/2011 | Andoh et al. | |
| 8,102,545 B2 | 1/2012 | Nanno et al. | |
| 8,113,670 B2 * | 2/2012 | Muraki et al. ................ | 353/122 |
| 2007/0279888 A1 | 12/2007 | Nanno et al. | |
| 2007/0285701 A1 | 12/2007 | Ohta et al. | |
| 2008/0006166 A1 | 1/2008 | Ohkubo et al. | |
| 2008/0175620 A1 | 7/2008 | Ohta et al. | |
| 2008/0180760 A1 | 7/2008 | Andoh et al. | |
| 2008/0180762 A1 | 7/2008 | Andoh et al. | |
| 2008/0181695 A1 | 7/2008 | Andoh et al. | |
| 2008/0181698 A1 | 7/2008 | Andoh et al. | |
| 2008/0291501 A1 | 11/2008 | Shiraki et al. | |

(Continued)

FOREIGN PATENT DOCUMENTS

| | | |
|---|---|---|
| JP | 11-261276 A | 9/1999 |
| JP | 2000-309139 A | 11/2000 |

(Continued)

*Primary Examiner* — Hung S Bui
(74) *Attorney, Agent, or Firm* — Harness, Dickey & Pierce, P.L.C.

(57) ABSTRACT

A holder for holding a cable noise suppressor for a cable to interconnect a first printed circuit board in a first housing to a second printed circuit board in a second housing includes a first guide to determine a position and a direction of the cable noise suppressor held at a first position in the holder, a second guide to determine a position and a direction of the cable noise suppressor held at a second position different from the first position in the holder, and a cable guide to guide the cable projecting from the cable noise suppressor. The cable noise suppressor is held at either the first position or the second position in accordance with the relative positions of the first housing and the second housing.

18 Claims, 9 Drawing Sheets

(56) References Cited

U.S. PATENT DOCUMENTS

| | | |
|---|---|---|
| 2008/0317498 A1 | 12/2008 | Andoh et al. |
| 2009/0022516 A1 | 1/2009 | Ohta et al. |
| 2009/0074495 A1 | 3/2009 | Shiraki et al. |
| 2009/0122330 A1 | 5/2009 | Andoh et al. |
| 2009/0162082 A1 | 6/2009 | Shiraki et al. |
| 2010/0021211 A1 | 1/2010 | Ogawa et al. |
| 2010/0052252 A1 | 3/2010 | Ohta |
| 2011/0075226 A1* | 3/2011 | Fujiwara ........................ 358/474 |
| 2013/0194736 A1* | 8/2013 | Ishii .......................... 361/679.02 |

FOREIGN PATENT DOCUMENTS

| | | |
|---|---|---|
| JP | 2002-027642 A | 1/2002 |
| JP | 2003-280305 A | 10/2003 |
| JP | 2005-150047 A | 6/2005 |
| JP | 2006-288177 A | 10/2006 |
| JP | 2007-139999 A | 6/2007 |
| JP | 2007-317776 A | 12/2007 |
| JP | 2009-067537 A | 4/2009 |

* cited by examiner

HOLDER FOR HOLDING CABLE NOISE SUPPRESSOR AND IMAGE FORMING SYSTEM INCORPORATING THE SAME

CROSS-REFERENCE TO RELATED APPLICATION

This patent application is based on and claims priority pursuant to 35 U.S.C. §119 to Japanese Patent Application No. 2011-053356, filed on Mar. 10, 2011, in the Japan Patent Office, the entire disclosure of which is hereby incorporated by reference herein.

FIELD OF THE INVENTION

The present invention generally relates to a holder for holding a cable noise suppressor, an electrophotographic image forming apparatus such as a copier, a printer, a plotter, a word processor, or a facsimile machine, or a multifunction machine having at least two of these capabilities, and an image forming system, and more particularly, to a holder for holding a cable noise suppressor, and an electrophotographic image forming apparatus or system, an ink-ejecting image forming apparatus or system, and screen-printing machine or system that uses the same.

BACKGROUND OF THE INVENTION

Typically, noise suppressors for noise suppression or noise filtering are provided to cables interconnecting electronic components together forming a system or apparatus. Various approaches have been proposed to hold and keep noise suppressors in position relative to the cable.

For example, JP-2007-317776-A proposes a flat cable holder including a lid and a noise suppressor holder (i.e., a ferrite core case) to hold the noise suppressor, such as a ferrite core. After wiring of the flat cable and setting of the ferrite core are completed, the lid is closed, thereby keeping the ferrite core in position relative to the flat cable.

Fixing the ferrite core relative to the flat cable, however, can entail the following inconvenience.

If the relative positions of the components interconnected by the flat cable are changed due to, for example, addition of an optional component, the cable route is changed. However, replacement of the cable is impractical because an end of the flat cable (i.e., connection to a connector) is generally disposed deep inside the apparatus. Although relay cables may be used, doing so requires a relay board as well, thus increasing the cost and size of the apparatus.

Therefore, even in a stripped-down apparatus without any optional components, the cable has a sufficient length to accommodate such an optional component, and flexible flat cables are widely used to attain higher flexibility in designing the cable route. Differences in the cable length inherent to the layout change can be absorbed relatively easily by slacking the flat cable.

Although this arrangement can eliminate the necessity of replacement of the flat cable, the direction of the portion where the noise suppressor is attached is fixed, and rigidity is added to portions of the cable adjacent to the entrance and the exit from the noise suppressor. Thus, the cable route around the noise suppressor is determined by the position and direction of the noise suppressor.

In conventional approaches, the ferrite core and the flat cable (flat harness) are fixed in a given route, and their positions are not changed even with changes in the cable route caused by the addition of optional components. Accordingly, the cable is unnecessarily long in the default setting because the cable length is increased to accommodate addition of the optional component. In this case, the cable is subjected to more noise, reliability can decrease, and the cost can increase.

BRIEF SUMMARY OF THE INVENTION

In view of the foregoing, one embodiment of the present invention provide a holder for holding a cable noise suppressor for a cable to interconnect a first printed circuit board in a first housing to a second printed circuit board in a second housing, disposable at multiple different positions relative to the first housing. The holder includes a first guide to determine a position and a direction of the cable noise suppressor held at a first position in the holder, a second guide to determine a position and a direction of the cable noise suppressor held at a second position different from the first position in the holder, and a cable guide to guide the cable projecting from the cable noise suppressor. The cable noise suppressor is held at either the first position or the second position in accordance with the relative positions of the first housing and the second housing.

In another embodiment, a n image forming apparatus includes a first housing containing a first printed circuit board, a second housing containing a second printed circuit board and disposable at multiple different positions relative to the first housing, a cable to interconnect the first printed circuit board to the second printed circuit board, a cable noise suppressor provided to the cable, and the above-described holder for holding the cable noise suppressor.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE INVENTION

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Figure 1:
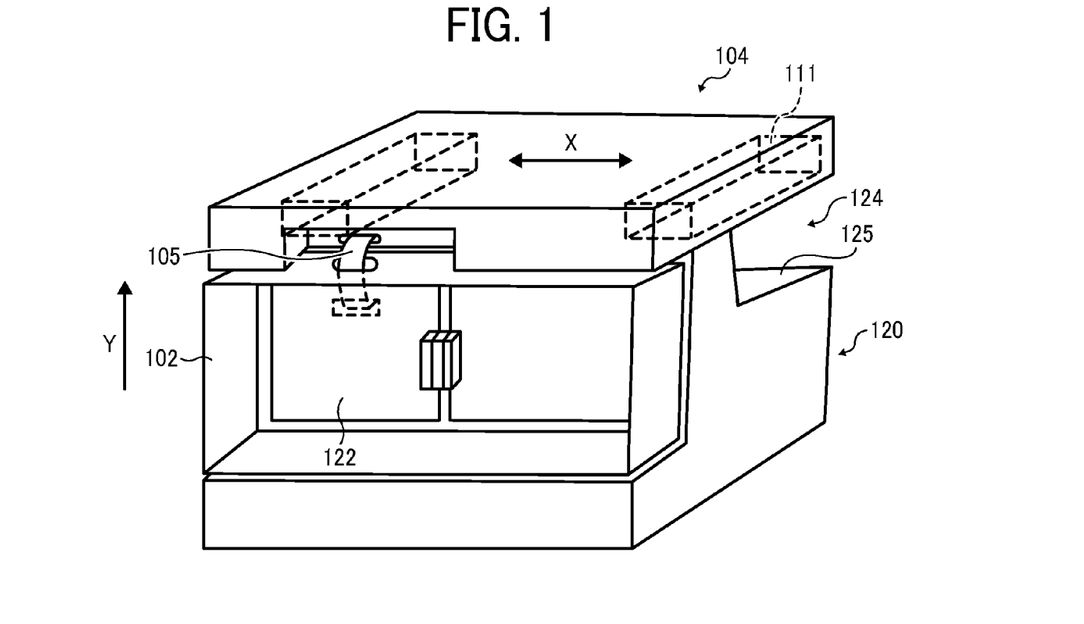
FIG. 1 is a perspective view illustrating an image forming apparatus.
Figure 2:
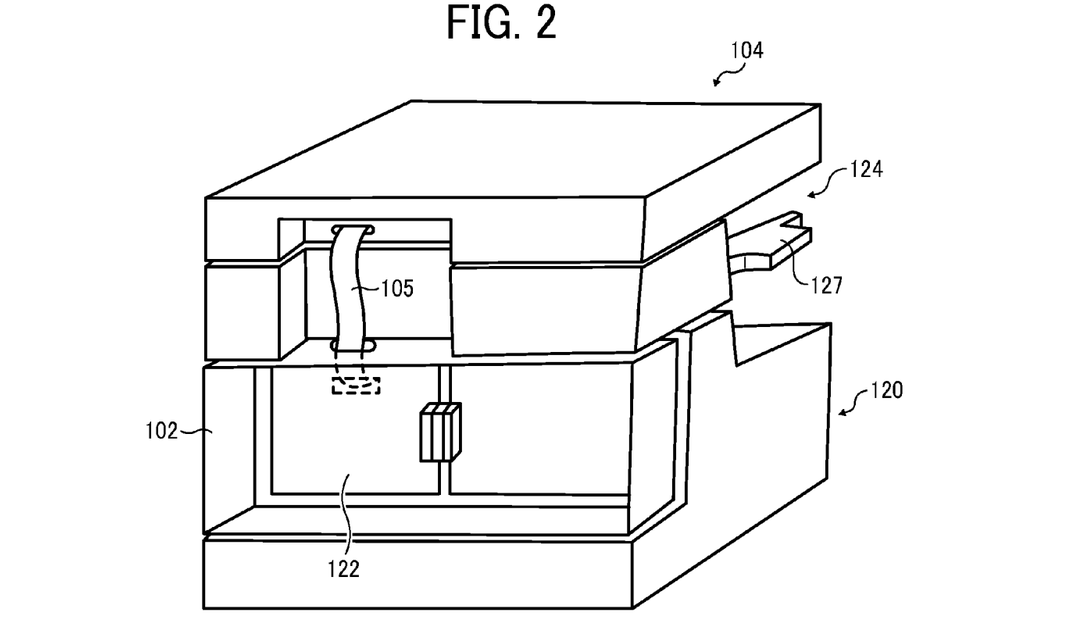
FIG. 2 is a perspective view illustrating a configuration in which an optional component (one-bin tray) is attached to the image forming apparatus shown in FIG. 1.
Figure 3:
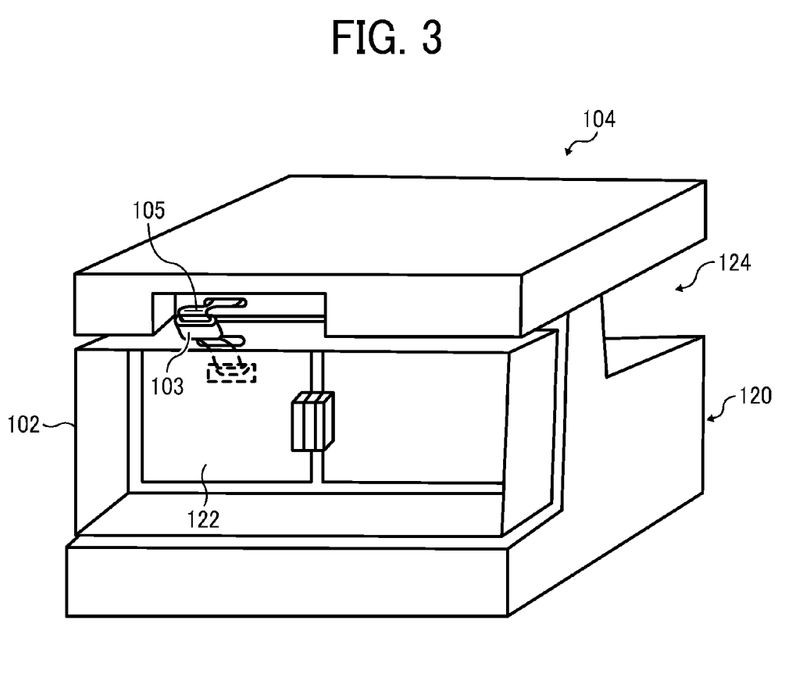
FIG. 3 is a perspective view illustrating cable wiring in the image formation apparatus shown in FIG. 1 to accommodate the optional one-bin tray.

Referring now to the drawings, wherein like reference numerals designate identical or corresponding parts throughout the several views thereof, and particularly to FIGS. 1 through 3, relative positions of multiple housings of an image forming apparatus and wiring therein according to an embodiment of the present invention is described. It is to be noted that, in the description below, some components may be omitted for simplicity and ease of understanding. In the configuration shown in FIGS. 1 through 3, relative positions of the multiple components (first and second housings) of the apparatus change in accordance with presence or absence of an optional component, and wiring of a cable is changed accordingly.

FIG. 1 is a perspective view that illustrates an image forming apparatus such as a multifunction printer (MFP), FIG. 2 is a perspective view illustrating the image forming apparatus shown in FIG. 1 to which an optional one-bin tray is attached, and FIG. 3 is a perspective view that illustrates cable wiring to accommodate the optional one-bin tray.

In FIG. 1, reference numerals 104 represents a scanner that serves as an image reading unit or a second housing, and 120 represents an apparatus body serving as an image forming apparatus or a first housing. It is to be noted that, in a narrow sense, the apparatus body 120 is interpreted as "an image forming apparatus". The scanner 104 and the apparatus body 120 together form an image forming apparatus or system in a broad sense.

Referring to FIG. 1, the scanner 104 includes a carriage 111 in which a light source, a reflecting minor, lenses, and a charge-coupled device (CCD) image sensor, together forming a reading unit, are housed. The carriage 111 can reciprocate in the direction indicated by arrow X shown in FIG. 1. The apparatus body 120 includes an electrical component box 102, serving as an inner casing, in which an electrical component board or printed circuit board (PCB) 122 is provided. The scanner 104 (i.e., a PCB of the carriage 111) and the PCB 122 in the apparatus body 120 are interconnected via a flat cable 105 serving as a cable for reciprocal transmission of signals, thus enabling scanning, copying, and the like.

The PCB 122 in the apparatus body 120 includes a controller such as a micro computer or various types of control circuits to control a sheet feeding unit, an image forming unit, and a fixing unit provided in the apparatus body 120 and respective driving units therefor according to signals from sensors or detectors provided in the respective units.

The image forming apparatus shown in FIG. 1 can be, for example, a low-end MFP, which typically includes a scanner in which the CCD image sensor and other components are united in the carriage as shown in FIG. 1 and uses the flat cable 105 for signal transmission. The configuration shown FIG. 1 is housing-internal discharge type, and sheets of recording media outputted from the apparatus body 120 are stacked on a discharge tray 125 provided in a housing-internal space 124, defined by an upper face of the apparatus body 120 and a lower face of the scanner 104.

An end (first end) of the flat cable 105 is fixed, for example, with double-sided adhesive tape, to an electrical component board of the carriage 111 not to hinder the movement of the carriage 111. A part of the flat cable 105 is exposed outside the apparatus, and the other end (second end) thereof is connected to the PCB 122 inside the apparatus body 120.

An one-bin tray 127 shown in FIG. 2 is an additional tray attached to the image forming apparatus for sorting sheets on which data received via, for example, facsimile machines, are recorded. Although disposing the one-bin tray 127 inside the housing-internal space 124 positioned between the scanner 104 and the apparatus body 120 can reduce the floor area occupied by the apparatus, the height of the apparatus increases. Therefore, the height of the scanner 104 is adjustable so that the height of the apparatus is reduced in a default setting and the housing-internal space 124 is expanded in the direction indicated by arrow Y shown in FIG. 1 when the one-bin tray 127 is attached to the apparatus.

When the scanner 104 is moved up, the route of the flat cable 105 becomes longer. Replacing the flat cable 105 in response to addition of the option component is impractical because the first end of the flat cable 105 is connected to the carriage 111 inside the scanner 104, which means that the scanner 104 must be disassembled.

Therefore, an identical flat cable 105 having a sufficient length to accommodate the one-bin tray 127 is used both in a default apparatus without an optional component and in the apparatus to which the optional component is added. In the default apparatus, the flat cable 105 is slackened and contained inside the scanner 104 as shown in FIG. 3. Thus, replacement of the flat cable 105 is not necessary, and attachment of the optional component can be easier.

In addition, a ferrite core 103 serving as a cable noise suppressor is attached to the flat cable 105 to suppress noise interfering with signals. At that time, the noise suppression capability of the ferrite core 103 is affected by the distance from a flat cable connector (e.g., 107 shown in FIG. 9) on the side of the electrical component box 102. Therefore, preferably the position of the cable noise suppressor is fixed for reliable noise suppression, and typically a noise suppressor holder or a core case is used.

It is important for noise suppression that the flat cable does not contact metal, the flat cable does not contact itself or another cable, and the ferrite core is positioned close to the connector. In the present embodiment, even when the flat cable 105 is slackened, noise and cost can be reduced with the features described below.

The present embodiment is described in further detail below with reference to FIGS. 4 and 5.

Figure 4:
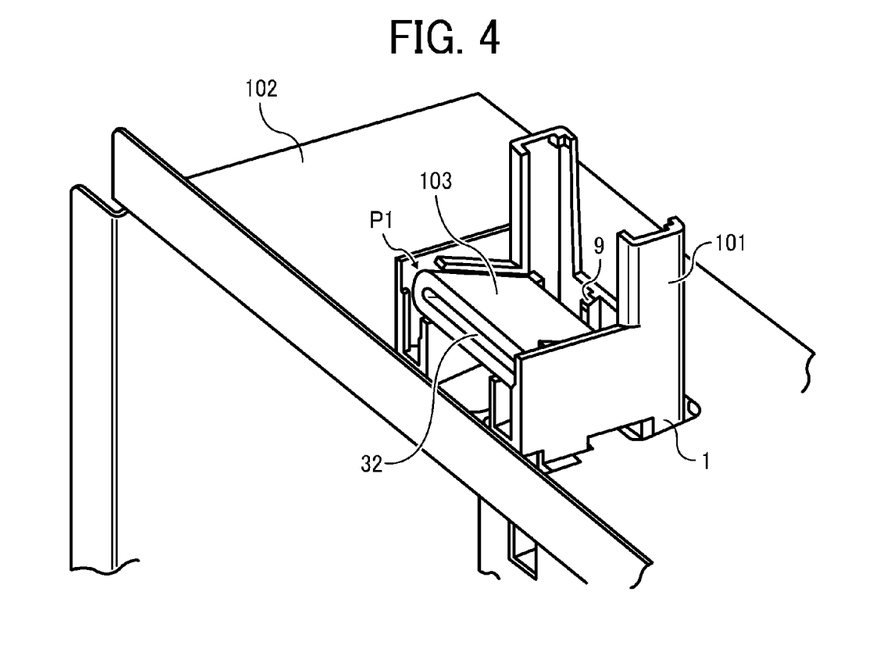
FIG. 4 is a perspective view that illustrates a state in which a ferrite core (cable noise suppressor) is held at a first position in a core holder.
Figure 5:
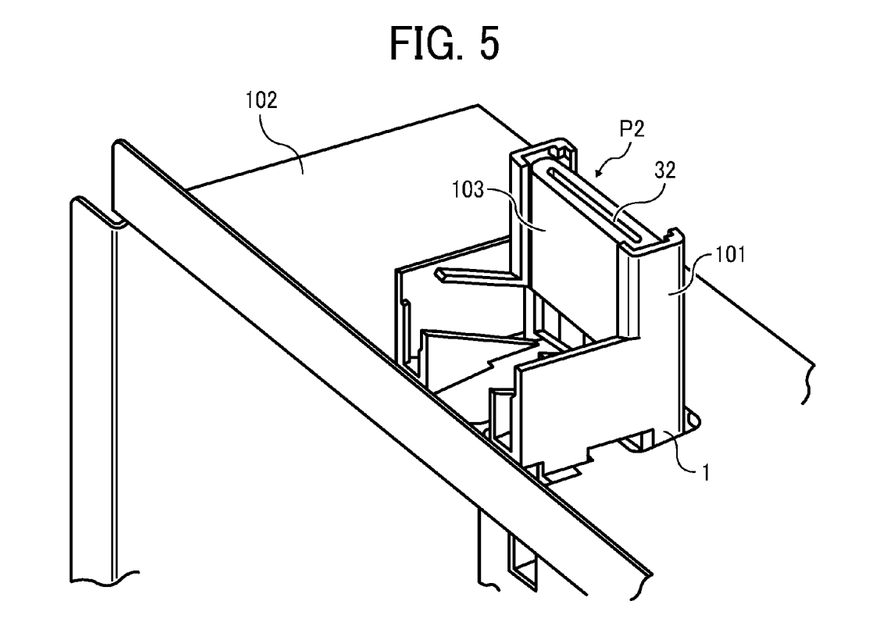
FIG. 5 is a perspective view that illustrates a state in which the ferrite core is held in a second holding portion in the core holder.

FIG. 4 is a perspective view that illustrates a state in which the ferrite core 103 is held in a core holder 101 and fixed at a first position P1, and FIG. 5 is a perspective view that illustrates a state in which the ferrite core 103 fixed at a second position P2 in the core holder 101. It is to be noted that, in FIGS. 4 and 5, reference numerals 1 represents a cable protector, 9 represents a cable guide, and 32 represents a through hole.

In FIGS. 4 and 5, the core holder 101 serves as a holder for fixing the cable noise suppressor (ferrite core 103) at multiple different positions. In the present embodiment, there are two positions.

In the present embodiment, the core holder 101 is attached to the electrical component box 102, and the ferrite core 103 can be fixed at either the first position P1 shown in FIG. 4 or the second position P2 shown in FIG. 5. The first position P1 is substantially horizontal, whereas the second position P2 is substantially vertical.

Figure 6:
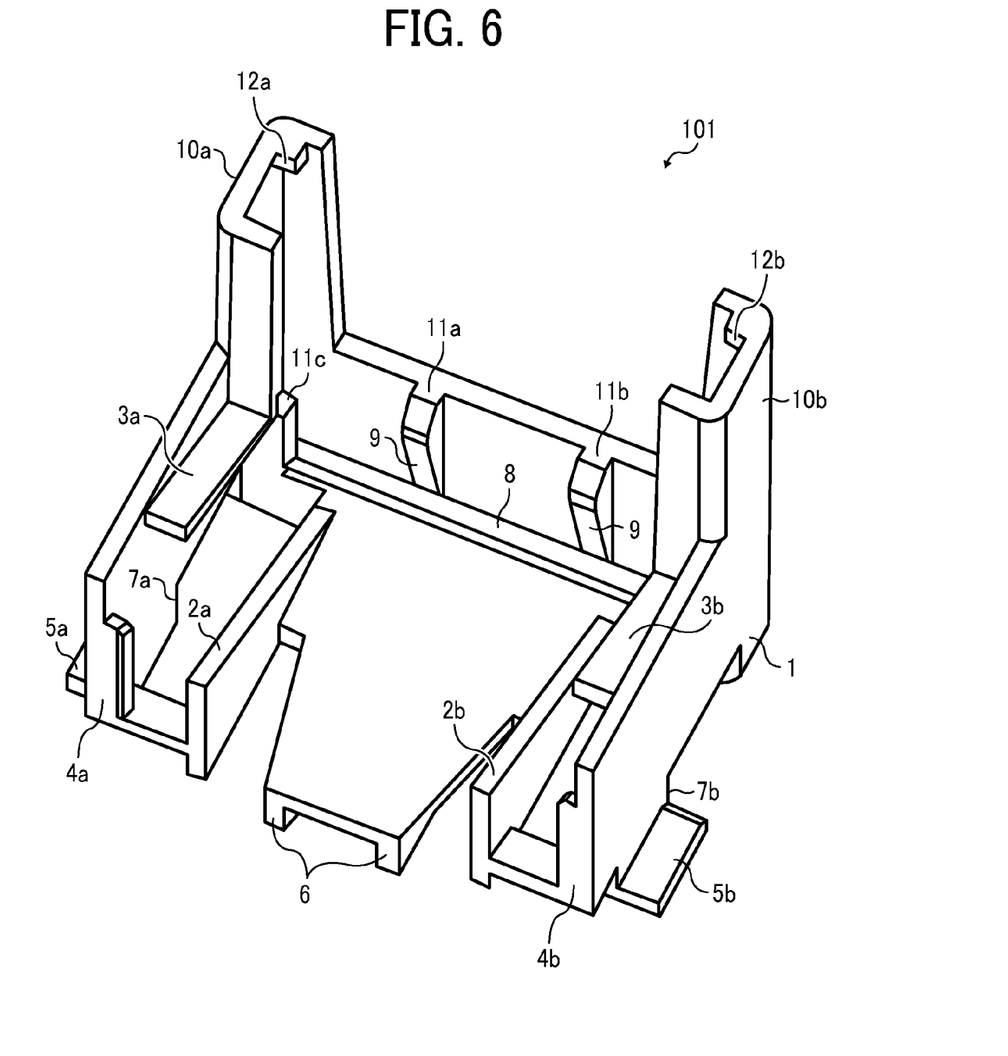
FIG. 6 is a perspective view illustrating the core holder.
Figure 7:
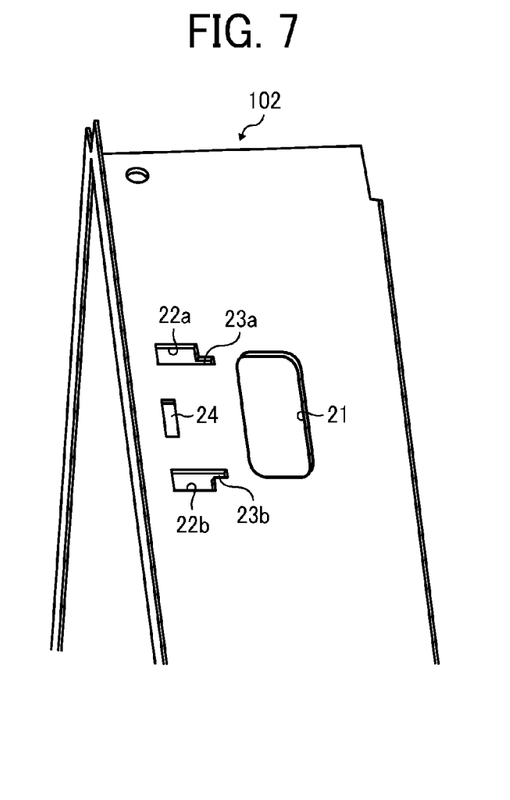
FIG. 7 is a perspective view illustrating an electrical component box.
Figure 8:
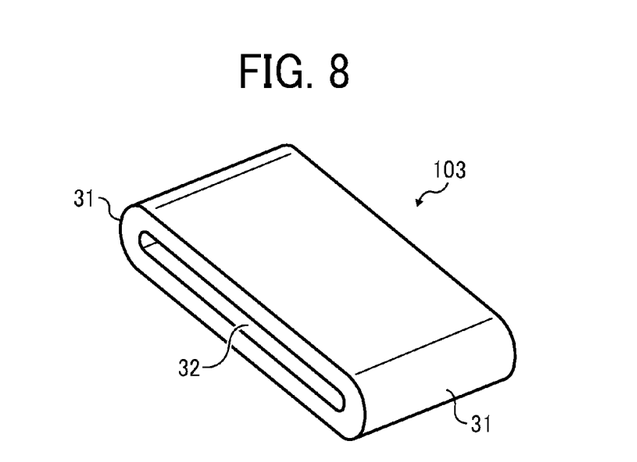
FIG. 8 is a perspective view of the ferrite core.

Referring to FIGS. 6 through 8, the core holder 101, the electrical component box 102, and the ferrite core 103 are described in further detail below.

FIGS. 6, 7, and 8 are perspective views respectively illustrating the core holder 101, the electrical component box 102, and the ferrite core 103 in detail. It is to be noted that, although the receiving portion 11d is not illustrated in FIG. 6, the receiving portions 11c and 11d are formed symmetrically.

As shown in FIG. 6, the core holder 101 includes the cable protector 1 to protect the cable projecting from the ferrite core 103, first core guides 2a, 2b, 3a, and 3b, pawls 4a and 4b, slidable pawls 5a and 5b, a pawl 6, positioning portions 7a and 7b, a cable outlet 8, the cable guide 9, second core guides 10a and 10b, receiving portions 11a, 11b, 11c, and 11d, and pawls 12a and 12b. The core holder 101 can be a single unit formed with, for example, polycarbonate (PC), acrylonitrile-butadiene-styrene resin, or engineering plastic. The cable guide 9 can be a sloped face formed inside the cable protector 1.

The first core guides 2a, 2b, 3a, and 3b, the pawls 4a and 4b, and the positioning portions 7a and 7b can serve as a first guide to determine a position and a direction of the ferrite core 103 (cable noise suppressor) held at a first position P1 in the core holder 101. The second core guides 10a and 10b, the receiving portions 11a, 11b, 11c, and 11d, and the pawls 12a and 12b can serve as a second guide to determine a position and a direction of the cable noise suppressor held at the second position P2 in the core holder 101. The pawls 4a and 4b can also serve as a first stopper to retain the cable noise suppressor at the first position P1, and the pawls 12a and 12b can also serve as a second stopper to retain the cable noise suppressor at the second position P2. The first guide and the second guide extend in different directions to guide the ferrite core 103 at different directions at the first and second positions P1 and P2, respectively.

The cable protector 1, the cable outlet 8, and the cable guide 9 serves as a cable guide to guide the flat cable 105 projecting from the cable noise suppressor. Additionally, a lower portion of the cable protector 1, the slidable pawls 5a and 5b, and the pawl 6 can serve as connection projections to be inserted inside either the first housing or the second housing (in the present embodiment, the apparatus body 120) from an engagement hole formed in either the first housing or the second housing.

As shown in FIG. 7, the electrical component box 102 can be a single unit constructed of a thin planer material such as iron and includes a cable through hole 21, retaining holes 22a and 22b, receiving portions 23a and 23b, and a slot 24.

As shown in FIG. 8, the ferrite core 103 includes guided portions 31 on both sides, and a through hole 32 into which the flat cable 105 is inserted is formed. The ferrite core 103 is constructed of ferrite, that is, a ferromagnetic metal oxide.

Next, attachment of the core holder 101 to the electrical component box 102 and that of the ferrite core 103 to the core holder 101 are described below.

The cable protector 1 and the slidable pawls 5a and 5b of the core holder 101 engage the cable through hole 21 and the retaining holes 22a and 22b, respectively. Thus, the cable through hole 21 and the retaining holes 22a and 22b can serve as engagement holes. When the core holder 101 is slid in this state until the positioning portions 7a and 7b of the core holder 101 contact the receiving portions 23a and 23b of the electrical component box 102, the pawl 6 engages the slot 24. Thus, the core holder 101 is fixed to the electrical component box 102.

The pawls 4a and 4b of the core holder 101 include flexible holding surfaces having elastic recoverability. While pushing outward the pawls 4a and 4b on both sides of the core holder 101, the ferrite core 103 is inserted into the core holder 101 with the guided portions 31 on both sides of the ferrite core 103 guided by the first core guides 2a, 2b, 3a, and 3b. When the ferrite core 103 comes into contact with a back end of the guide, the ferrite core 103 passes by the pawls 4a and 4b. Thus, the ferrite core 103 is fixed at the first position P1 (shown in FIG. 4) in the core holder 101.

Additionally, the pawls 12a and 12b of the core holder 101 include flexible holding surfaces having elastic recoverability similarly to the holding surfaces of the pawls 4a and 4b. While pushing outward the pawls 12a and 12b of the core holder 101, the ferrite core 103 is inserted into the core holder 101 with the guided portions 31 on both sides of the ferrite core 103 guided by the second core guides 10a and 10b of the core holder 101. When the ferrite core 103 comes into contact with the receiving portions 11a, 11b, 11c, and 11d, the ferrite core 103 is fixed at the second position P2 (shown in FIG. 5) in the core holder 101.

As described above, in the core holder 101, a space (clearance) is secured for the first core guides 2a, 2b, 3a, and 3b, which hold the ferrite core 103 at the first position P1, and the second core guides 10a and 10b, which hold the ferrite core 103 at the second position P2, to communicate each other. Accordingly, the flat cable 105 can be inserted to and fixed at the first position P1 and the second position P2.

The above-described configuration can attain the following advantages.

In FIG. 4, when the flat cable 105 is inserted into the through hole 32 of the ferrite core 103 being fixed at the first position P1 in the core holder 101, the flat cable 105 can be guided by the cable guide 9, exit from the cable outlet 8 (shown in FIG. 6), and then enter the electrical component box 102. At that time, the cable protector 1 separates the flat cable 105 from the electrical component box 102, thus preventing the contact therebetween.

As described above, the core holder 101 is positioned so that a part of the core holder 101 penetrates into the electrical component box 102, serving as the casing of the apparatus body 120 that contains the PCB 122.

In FIG. 5, when the flat cable 105 is inserted into the through hole 32 of the ferrite core 103 being fixed at the second position P2 in the core holder 101, the flat cable 105 can go straight, exit from the cable outlet 8 (shown in FIG. 6), and then enter the electrical component box 102. At that time, the cable protector 1 separates the flat cable 105 from the electrical component box 102, thus preventing contact therebetween. The flat cable 105 projecting from the cable noise suppressor held at the first position P1 and the flat cable 105 projecting from the cable noise suppressor held at the second position P1 exit from an identical cable outlet 8.

With this configuration, generation of noise can be reduced regardless of the position of the ferrite core 103, namely, the first and second positions P1 and P2.

Additionally, a clearance wider than the width of the flat cable 105 is provided between the first core guides 2a, 2b, 3a, and 3b and the second core guides 10a and 10b, thereby enabling the flat cable 105 to move. Thus, the position of the ferrite core 103 installed in the core holder 101 can be changed from the first position P1 to the second position P2 with the flat cable 105 inserted in the through hole 32 formed in the ferrite core 103.

Accordingly, it is not necessary to disengage the flat cable 105 from the connector each time the position of the ferrite core 103 is changed, thus streamlining attachment of optional components and shortening the required time. As a result, users' convenience can be improved.

Additionally, the core holder 101 includes a portion where the distance between the second core guides 10a and 10b on both sides is wider than the width of the flat cable 105. With this configuration, when the ferrite core 103 is disposed at the first position P1, the flat cable 105 can lie also between the second core guides 10a and 10b. Thus, the flat cable 105 can be laid within a reduced space, and the apparatus can become compact.

Referring to FIGS. 9A through 11B, descriptions are given below of changes in wiring of the flat cable 105 when the scanner 104 is attached to the image forming apparatus in relation to comparative configurations.

It is to be noted that, in FIGS. 9A through 12B, hatching of the cross sections of the scanner 104, the apparatus body 120, and the electrical component box 102, serving as the first housing and the second housing, is omitted for simplicity.

Figure 9A:
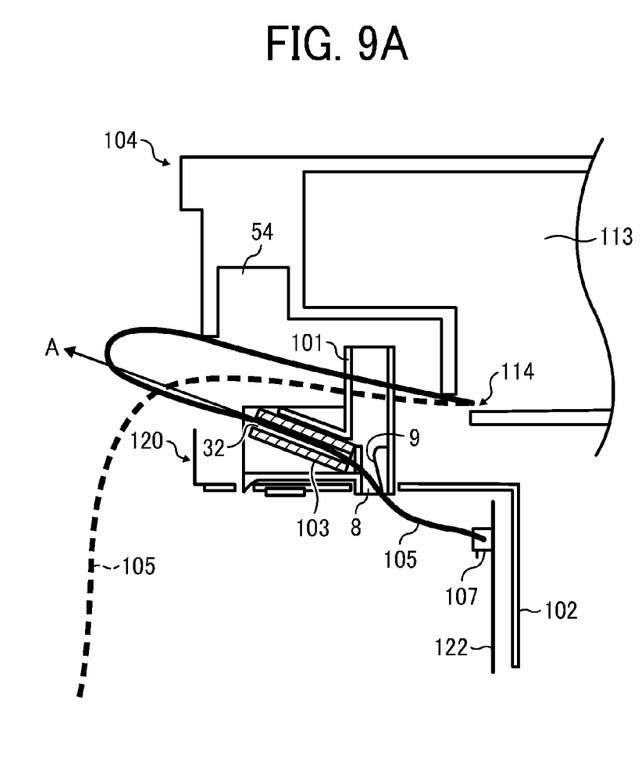
FIGS. 9A and 9B are cross-sectional views illustrating wiring of the flat cable in attachment of the scanner to the image forming apparatus.
Figure 9B:
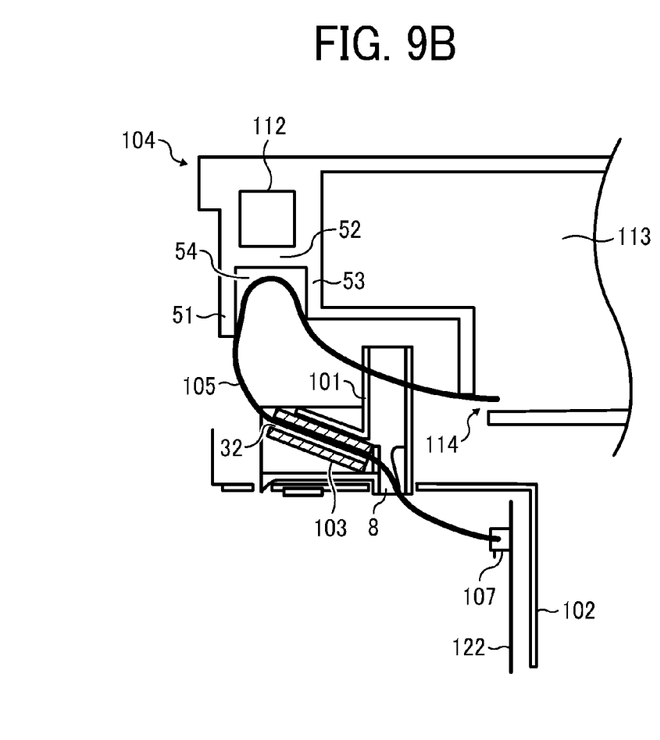
Figure 10A:
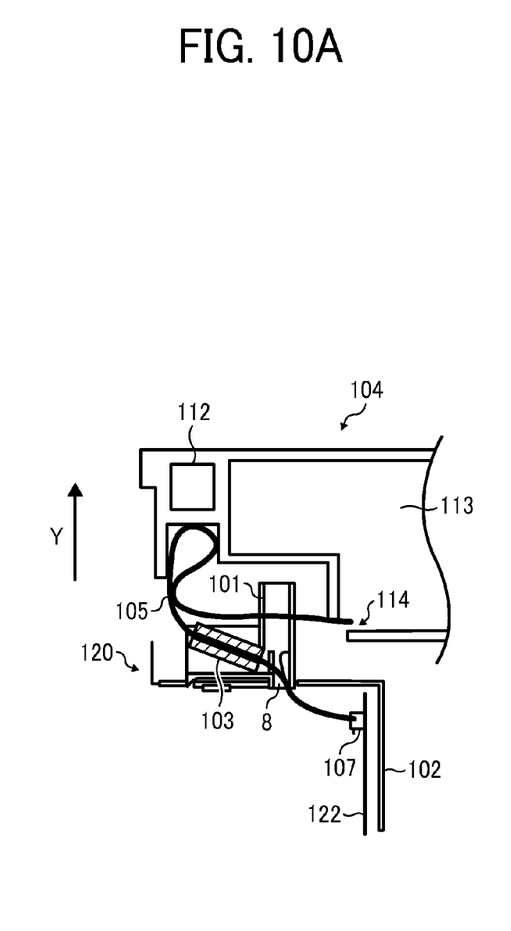
FIG. 10A is a cross-sectional view illustrating wiring of the flat cable in a comparative apparatus when an optional tray is not attached.
Figure 10B:
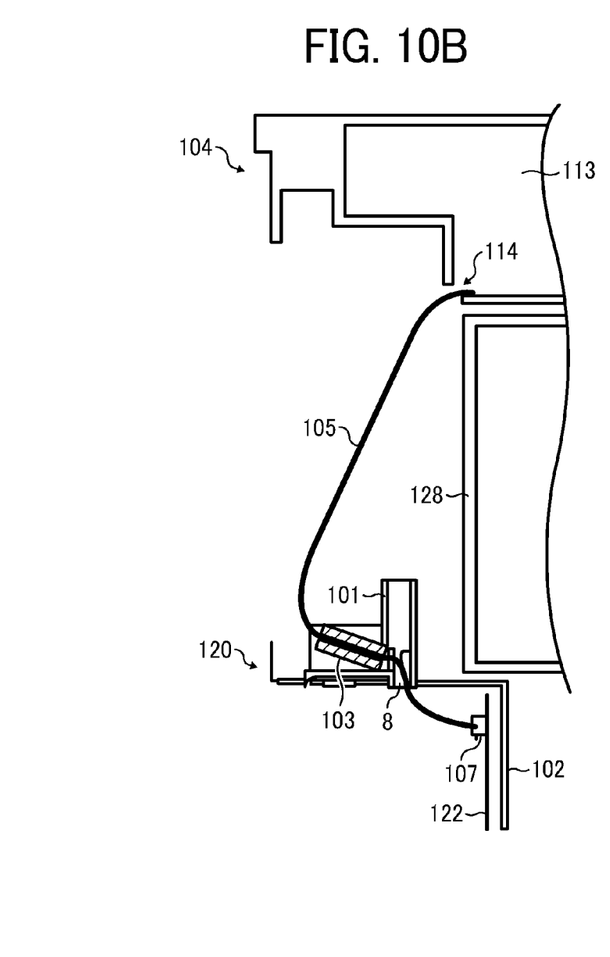
FIG. 10B is a cross-sectional view illustrating wiring of the flat cable in the comparative apparatus when the optional component is added but the position of the ferrite core is not changed.
Figure 11A:
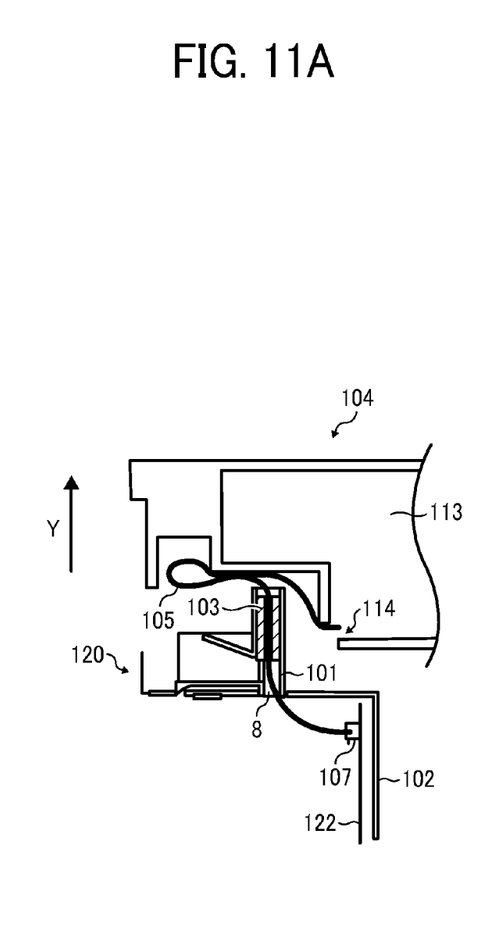
FIG. 11A is a cross-sectional view illustrating wiring of the flat cable in another comparative apparatus when an optional tray is not attached to the apparatus.
Figure 11B:
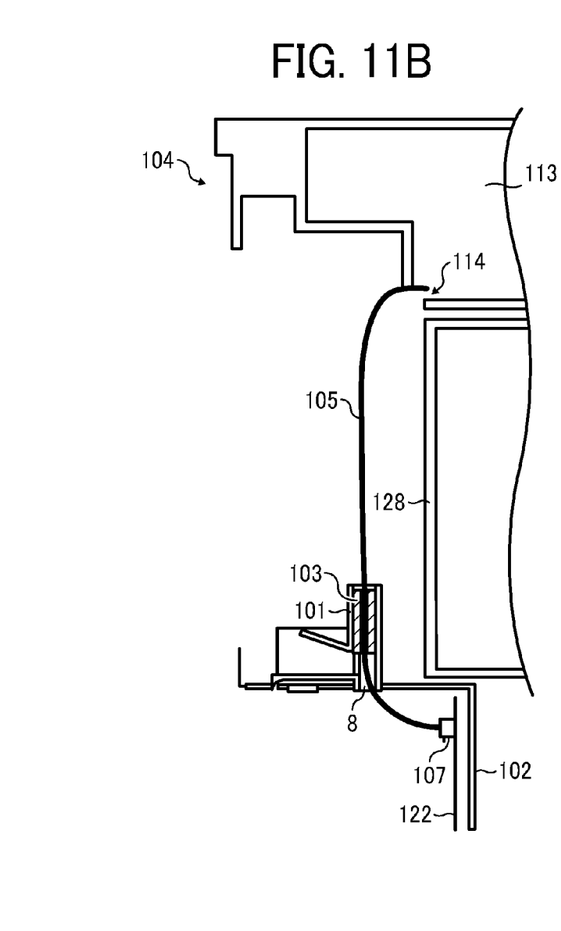
FIG. 11B is a cross-sectional view illustrating wiring of the flat cable in the comparative apparatus when the optional tray is added but the position of the ferrite core is not changed.

FIGS. 9A and 9B are cross-sectional views illustrating changes in wiring of the flat cable 105 when the scanner 104 is attached to the image forming apparatus. FIGS. 10A and 10B are cross-sectional views illustrating wiring of the flat cable in a comparative apparatus in which the position of the ferrite core is not changed even when an optional tray is attached to the apparatus: the optional tray is not added in FIG. 10A but is added in FIG. 10B. FIGS. 11A and 11B are cross-sectional views illustrating wiring of the flat cable in another comparative apparatus in which the position of the ferrite core is not changed even when an optional tray is attached to the apparatus: the optional tray is not added in FIG. 11A but is added in FIG. 11B.

The scanner 104 is attached to the apparatus body 120 as follows. Referring to FIG. 9A, the scanner 104 is attached to the apparatus body 120 from above with the flat cable 105 hanging down from a cable outlet 114 formed in the scanner 104. The scanner 104 should be held with both hands because it is heavy. Accordingly, in attachment of the scanner 104, the flat cable 105 is hung outside the electrical component box 102 as indicated by broken lines shown in FIG. 9A.

After the scanner 104 is fixed on the apparatus body 120, the flat cable 105 is inserted into the through hole 32 of the ferrite core 103 as indicated by a solid line. Then, the flat cable 105 contacts the cable guide 9, changes its direction, and enters the electrical component box 102 through the cable outlet 8. The cable outlet 8 is positioned inside the electrical component box 102. Accordingly, the flat cable 105 can be disposed without contacting the electrical component box 102. Subsequently, when connected to the cable connector 107, the flat cable 105 acquires rigidity due to its flexibility and is caused to extend in the straight direction A shown in FIG. 9A through the through hole 32.

As shown in FIG. 9B, in an upper portion on the back side of the scanner 104, an upward recess 54 is formed, defined by a vertical wall 51 closer to the above-described direction A, as well as a lateral wall 52 and another vertical wall 53. When the flat cable 105 is pushed in the upward recess 54 beyond the vertical wall 51, the flat cable 105 is disposed in contact with the walls 51, 52, and 53 due to the rigidity thereof. Accordingly, when the upward recess 54 is sufficiently large, the flat cable 105 does not contact itself. Additionally, the flat cable 105 can be housed in the upward recess 54 with a reliable length kept from the cable connector 107 to the ferrite core 103. Thus, noise can be reduced. The upward recess 54 may be defined by a continuous curved face not straight faces as shown in FIGS. 9A and 9B.

It is to be noted that, in FIG. 9B, reference numerals 112 represents a harness route inside the scanner 104, and 113 represents a movable range of the carriage 111.

Securing such an upward recess 54 sufficient in size, however, is difficult in compact apparatuses. If the ferrite core 103 is positioned similarly in both the default apparatus without the optional one-bin tray 127 (shown in FIG. 10A) and the expanded apparatus 128 to which the optional one-bin tray 127 is attached (shown in FIG. 10B), the length of the flat cable 105 (hereinafter simply "cable length") increases, and the slackage of the flat cable 105 is excessive in the default apparatus as shown in FIG. 10A. Moreover, the increase in the cable length can aggravate noise.

Additionally, if the ferrite core 103 is disposed vertically, slackage of the flat cable 105 can be reduced when the optional one-bin tray 127 is attached to the apparatus as shown in FIG. 11B. However, as shown in FIG. 11A, when the one-bin tray 127 is not attached to the apparatus and the scanner 104 is at the lower position, it is difficult to prevent the flat cable 105 from contacting itself, and assembling is difficult.

By contrast, the present embodiment can attain the following effects.

Figure 12A:
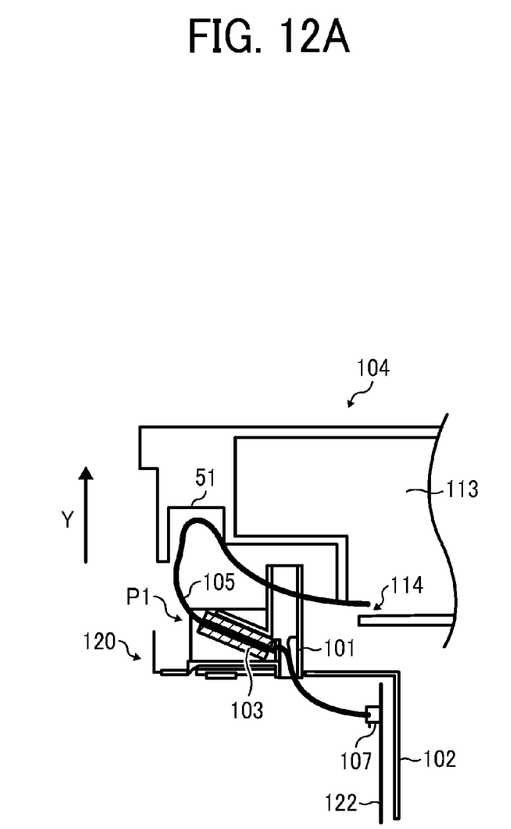
FIG. 12A is a cross-sectional view illustrating wiring of the flat cable in an embodiment when the optional tray is not added and the ferrite core is at the first position.

FIG. 12A are cross-sectional views illustrating changes in wiring of the flat cable 105 in the present embodiment in accordance with presence or absence of the optional tray (one-bin tray 127). In FIG. 12A, the optional tray (one-bin tray 127) is not added, and the ferrite core 103 is at the first position P1. By contrast, in FIG. 12B, the optional tray is added to the apparatus, and the ferrite core 103 is at the second position P2.

An angle from a horizontal face to the first position P1 (shown in FIG. 12A) in the core holder 101 is smaller than an angle from the horizontal face to the second position P2 (shown in FIG. 12B) in the core holder 101. The ferrite core 103 is held at the first position P1 when the scanner 104 (second housing) is at a first height above the apparatus body 120 (first housing), and the ferrite core 103 is held at the second position P2 when the scanner 104 is at a second height higher than the first height.

Figure 12B:
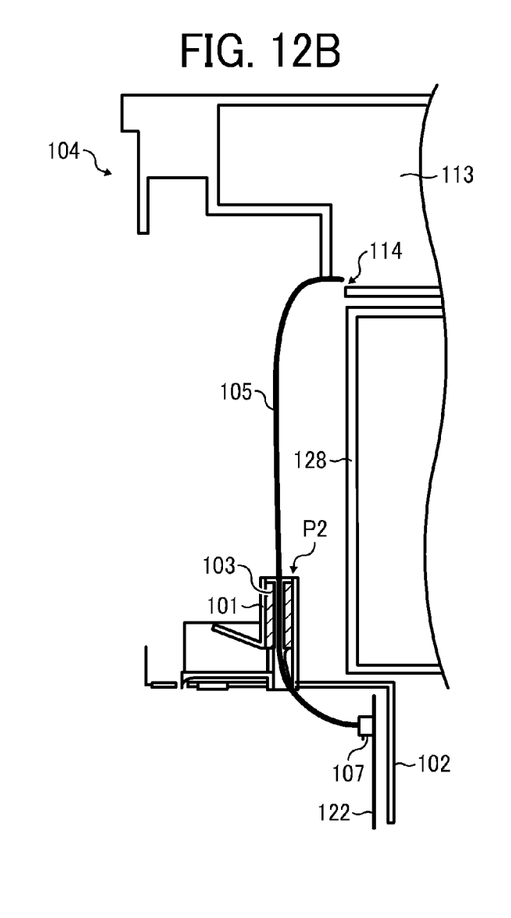
FIG. 12B is a cross-sectional view illustrating wiring of the flat cable in the embodiment when the optional tray is added to the apparatus and the ferrite core is at the second position.

In the present embodiment, as shown in FIGS. 12A and 12B, the position of the ferrite core 103 in the core holder 101 can be changed between the first and second positions P1 and P2. Therefore, when the one-bin tray 127 is attached to the apparatus, the ferrite core 103 is at the second position P2 to reduce the slackage of the cable to minimum. When the one-bin tray 127 is not attached to the apparatus, the ferrite core 103 is at the first position P1, and the flat cable 105 can be prevented from contacting itself. This configuration can attain both keeping the cable length optimum and prevention of contact of the cable at relatively low cost.

Thus, in the present embodiment, the ferrite core 103 serving as the cable noise suppressor can be held at either the first position P1 or the second position P2 in the core holder 101 in accordance with arrangement of the first and second housings. Accordingly, the cable route, which depends on the presence or absence of the optional tray, can be optimized, and changes in the cable length between the different cable routes can be reduced. Simultaneously, noise and the cost can be reduced.

It is to be noted that the angle between the first and the second positions P1 and P2 is not limited to the description above but can be determined in view of the connection and relative positions of multiple electronic devices, electrical devices, and housings in the system.

Additionally, although a single ferrite core 103 held in a single core holder 101 is connected to a single flat cable 105 in the description above, features of the present embodiment can adapt to other configurations, for example, configurations in which multiple ferrite cores 103 held in the respective core holders 101 are connected to a single flat cable 105 and configurations in which multiple flat cables are used for connection of the electronic component board in the image forming apparatus.

The apparatus in which the holder for holding the cable noise suppressor is incorporated is not limited to electrophotographic MFPs but can be electrophotographic or magnetic recording copiers, printers, plotters, word processors, and facsimile machines; inkjet printers; and printing machines such as screen printing machines, and further can be image forming apparatuses connected via the Internet or a local area network (LAN), and image forming systems including peripheral devices such as computers.

For example, image forming systems include an image forming apparatus and post-processing apparatus (sheet processing apparatus) connected to the image forming apparatus mechanically as well as communicably. Post-processing apparatuses include at least one of a sorter, a puncher, a stapler, an inserter (such as disclosed in JP-2003-280305-A) capable of feeding sheets outside the image forming apparatus, and a sheet folding device (such as disclosed in JP-2009-67537-A).

Numerous additional modifications and variations are possible in light of the above teachings. It is therefore to be understood that, within the scope of the appended claims, the disclosure of this patent specification may be practiced otherwise than as specifically described herein.

What is claimed is:

1. A holder for holding a cable noise suppressor for a cable to interconnect a first printed circuit board in a first housing to a second printed circuit board in a second housing, disposable at multiple different positions relative to the first housing the holder comprising:
   a first guide to determine a position and a direction of the cable noise suppressor held at a first position in the holder;
   a second guide to determine a position and a direction of the cable noise suppressor held at a second position different from the first position in the holder; and
   a cable guide to guide the cable projecting from the cable noise suppressor,
   wherein the cable noise suppressor is held at either the first position or the second position in accordance with the relative positions of the first housing and the second housing.

2. The holder according to claim 1, further comprising a first stopper and a second stopper to retain the cable noise suppressor at the first position and the second position, respectively.

3. The holder according to claim 2, wherein each of the first stopper and the second stopper comprises a flexible pawl.

4. The holder according to claim 1, further comprising a clearance through which the first position and the second position communicate with each other.

5. The holder according to claim 1, wherein the cable is a flat cable.

6. The holder according to claim 1, further comprising a connection projection to be inserted inside either the first housing or the second housing from an engagement hole formed in either the first housing or the second housing.

7. The holder according to claim 6, wherein an end portion of the cable guide is disposed in the connection projection inserted into either the first housing or the second housing.

8. The holder according to claim 1, wherein the second position is at a different angle from the first position in the holder, and the first guide and the second guide extend in different directions.

9. The holder according to claim 1, wherein the cable guide of the holder comprises a common cable outlet for the cable projecting from the cable noise suppressor held at the first position and the cable projecting from the cable noise suppressor held at the second position.

10. An image forming apparatus comprising:
    a first housing containing a first printed circuit board;
    a second housing containing a second printed circuit board and disposable at multiple different positions relative to the first housing;
    a cable to interconnect the first printed circuit board to the second printed circuit board;
    a cable noise suppressor provided to the cable; and
    a holder for holding the cable noise suppressor, including:
       a first guide to determine a position and a direction of the cable noise suppressor held at a first position in the holder;
       a second guide to determine a position and a direction of the cable noise suppressor held at a second position different from the first position in the holder; and
       a cable guide to guide the cable projecting from the cable noise suppressor,
       wherein the cable noise suppressor is held at either the first position or the second position in accordance with the relative positions of the first housing and the second housing.

11. The image forming apparatus according to claim 10, further comprising a first stopper and a second stopper to retain the cable noise suppressor at the first position and the second position, respectively.

12. The image forming apparatus according to claim 11, wherein each of the first stopper and the second stopper comprises a flexible pawl.

13. The image forming apparatus according to claim 10, wherein the first housing is a main body of the apparatus, and the second housing is an image reading unit.

14. The image forming apparatus according to claim 10, wherein the holder further comprises a clearance through which first position and the second position communicate with each other.

15. The image forming apparatus according to claim 10, wherein the cable is a flat cable.

16. The image forming apparatus according to claim 10, further comprising a connection projection to be inserted inside either the first housing or the second housing from an engagement hole formed in either the first housing or the second housing.

17. The image forming apparatus according to claim 10, wherein the second position is at a different angle from the first position in the holder, and the first guide and the second guide extend in different directions.

18. The image forming apparatus according to claim 17, wherein an angle from a horizontal face to the first position in the holder is smaller than an angle from the horizontal face to the second position in the holder, the cable noise suppressor is held at the first position of the holder when the second housing is at a first height above the first housing, and the cable noise suppressor is held at the second position of the holder when the second housing is at a second height higher than the first height above the first housing.

\* \* \* \* \*